United States Patent
Park et al.

(10) Patent No.: US 8,390,751 B2
(45) Date of Patent: Mar. 5, 2013

(54) DISPLAY DEVICE AND METHOD OF MANUFACTURING THE SAME

(75) Inventors: Kyung-Min Park, Yongin (KR); Ji-Yong Park, Yongin (KR); Jin-Suk Park, Yongin (KR); Sung-In Ro, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 265 days.

(21) Appl. No.: 12/957,233

(22) Filed: Nov. 30, 2010

(65) Prior Publication Data
US 2011/0134381 A1    Jun. 9, 2011

(30) Foreign Application Priority Data
Dec. 9, 2009    (KR) .................. 10-2009-0121773

(51) Int. Cl.
G02F 1/1343    (2006.01)
H01L 21/00    (2006.01)

(52) U.S. Cl. ................ 349/38; 349/39; 438/34

(58) Field of Classification Search .......... 349/38, 349/39; 438/34; 257/E51.018
See application file for complete search history.

(56) References Cited

U.S. PATENT DOCUMENTS

| | | | |
|---|---|---|---|
| 5,844,647 A | 12/1998 | Maruno et al. | |
| 6,356,318 B1* | 3/2002 | Kawahata | 349/38 |
| 6,953,949 B2* | 10/2005 | Murade | 257/59 |
| 7,202,115 B2 | 4/2007 | Hirano et al. | |
| 7,335,917 B2 | 2/2008 | Koo et al. | |
| 7,619,695 B2* | 11/2009 | Nomura et al. | 349/38 |
| 7,652,291 B2 | 1/2010 | Koo et al. | |
| 7,839,462 B2* | 11/2010 | Lin | 349/47 |
| 2005/0189535 A1 | 9/2005 | Hsueh et al. | |
| 2007/0170845 A1 | 7/2007 | Choi et al. | |
| 2007/0273800 A1* | 11/2007 | Nomura et al. | 349/38 |
| 2010/0062553 A1 | 3/2010 | Sung et al. | |
| 2010/0117073 A1* | 5/2010 | Yamazaki et al. | 257/43 |
| 2012/0007083 A1* | 1/2012 | You et al. | 257/59 |
| 2012/0080663 A1* | 4/2012 | Lee et al. | 257/40 |

FOREIGN PATENT DOCUMENTS

| | | |
|---|---|---|
| CN | 101354513 A | 1/2009 |
| EP | 2 023 194 A1 | 2/2009 |
| JP | 2000-091585 A | 3/2000 |
| JP | 2001-242803 A | 9/2001 |
| JP | 2005-031251 A | 2/2005 |

(Continued)

OTHER PUBLICATIONS

Korean Office Action dated Jul. 29, 2011 for Korean Patent Application No. KR 10-2009-0100197 corresponding to U.S. Appl. No. 12/792,639 which is related to captioned U.S. Appl. No. 12/957,233.

(Continued)

Primary Examiner — Mike Qi
(74) Attorney, Agent, or Firm — Knobbe, Martens, Olson & Bear LLP

(57) ABSTRACT

A display device and a method of manufacturing the same are disclosed. In one embodiment, the display device includes: i) a first insulating layer formed on a first substrate, ii) a lower electrode formed on the first insulating layer, iii) a dielectric layer formed to surround the top and side of the lower electrode, wherein the dielectric layer does not cover a pixel region of the display device and iv) an upper electrode formed on the dielectric layer.

20 Claims, 10 Drawing Sheets

FOREIGN PATENT DOCUMENTS

| | | | |
|---|---|---|---|
| JP | 2005-209583 | A | 8/2005 |
| JP | 2009-076890 | A | 4/2009 |
| KR | 10-2004-00552023 | A | 3/2005 |
| KR | 10-0482328 | B1 | 3/2005 |
| KR | 10-2005-0072700 | A | 7/2005 |
| KR | 10-2006-0078581 | A | 7/2006 |
| KR | 10-0674238 | B1 | 1/2007 |
| KR | 1020070025151 | | 3/2007 |
| KR | 10-0708722 | B1 | 4/2007 |
| KR | 10-2007-0115355 | A | 12/2007 |
| KR | 10-2008-0097056 | A | 11/2008 |
| KR | 10-0867926 | B1 | 11/2008 |
| KR | 10-2009-0116131 | A | 11/2009 |

OTHER PUBLICATIONS

Chinese Office Action dated Mar. 27, 2012 for Chinese Patent Application No. CN 201010222035.1 which shares priority of Korean Patent Application No. KR 10-2009-0100197 with U.S. Appl. No. 12/792,639, filed Jun. 2, 2010, which is related to captioned U.S. Appl. No. 12/957,233.

Japanese Office Action dated Jun. 5, 2012 for Japanese Patent Application No. JP 2010-108551 corresponding to Korean Patent Application No. KR 10-2009-0100197 which corresponds to U.S. Appl. No. 12/792,639, filed Jun. 2, 2010, which is related to captioned U.S. Appl. No. 12/957,233.

Office Action dated Jul. 17, 2012 for U.S. Appl. No. 12/792,639, filed Jun. 2, 2010, which is related to captioned U.S. Appl. No. 12/957,233.

Korean Office Action dated Nov. 30, 2011 for Korean Patent Application No. KR 10-2009-0121773 which corresponds to captioned U.S. Appl. No. 12/957,233.

Korean Office Action dated Jun. 28, 2011 for Korean Patent Application No. 10-2009-0117878 corresponding to U.S. Appl. No. 12/957,246, filed Nov. 30, 2010, which is related to captioned U.S. Appl. No. 12/957,233.

Korean Office Action dated Mar. 21, 2011 for Korean Patent Application No. KR 10-2009-0121773 which corresponds to the captioned application.

Korean Office Action dated Mar. 21, 2011 for Korean Patent Application No. KR 10-2009-0117878 corresponding to U.S. Appl. No. 12/957,246, filed Nov. 30, 2010, which is related to the captioned application.

Notice of Allowance dated Nov. 14, 2012 for U.S. Appl. No. 12/957,246, filed Nov. 30, 2010, which is related to captioned U.S. Appl. No. 12/957,233.

Notice of Allowance dated Nov. 15, 2012 for U.S. Appl. No. 12/792,639, filed Jun. 2, 2010, which is related to captioned U.S. Appl. No. 12/957,233.

* cited by examiner

DISPLAY DEVICE AND METHOD OF MANUFACTURING THE SAME

CROSS-REFERENCE TO RELATED APPLICATIONS

This application claims priority to and the benefit of Korean Patent Application No. 10-2009-0121773, filed on Dec. 9, 2009, in the Korean Intellectual Property Office, the entire content of which is incorporated herein by reference. This application relates to U.S. patent application Ser. No. 12/792,639 filed on Jun. 2, 2010. This application also relates to "Flat panel display device and method of manufacturing the same"application Ser. No. 13/042,986, which is concurrently filed as this application and incorporated herein by reference in its entirety.

BACKGROUND

1. Field

The disclosed technology relates to a display device and a method of manufacturing the same.

2. Description of the Related Technology

Types of flat panel display devices include, for example, a liquid crystal display device using electro-optical characteristics of liquid crystal and an organic light emitting display device using self-emission characteristics of an organic light emitting diode. They are further categorized based on whether the display uses a passive matrix or an active matrix technology. Since the active matrix type, which uses thin film transistors, has excellent resolution and capability to display video content, it is used more frequently than the passive matrix type.

SUMMARY OF CERTAIN INVENTIVE ASPECTS

One aspect of the present invention is a display device capable of preventing the deterioration of optical transmittance resulting from use of to an insulating layer.

Another aspect is a method of manufacturing the display device.

Another aspect is a display device which includes: a first insulating layer positioned on a first substrate; a lower electrode positioned on the first insulating layer; a dielectric layer formed to surround the top and side of the lower electrode; and an upper electrode positioned on the dielectric layer.

Another aspect is a method of manufacturing a display device. First, a first insulating layer is formed on a substrate. Subsequently, a lower electrode is formed on the first insulating layer. A second insulating layer applied with the lower electrode is formed on the first insulating layer. A conductive layer is formed on the second insulating layer. Thereafter, an etching mask having an outer side positioned outer than the outer side of the lower electrode is formed on the conductive layer. The conductive layer and the second insulating layer are changed to an upper electrode and a dielectric layer, respectively, by performing an etching process on the conductive layer and the second insulating layer until the first insulating layer is exposed by using the etching mask.

Another aspect is a method of manufacturing a display device. First, a first insulating layer is formed on a substrate. A lower electrode is formed on the first insulating layer. A second insulating layer applied with the lower electrode is formed on the first insulating layer. An upper electrode that overlaps the lower electrode is formed on the second insulating layer. An etching mask that covers the side and top of the upper electrode and has an outer side positioned outer than the outer side of the lower electrode is formed on the second insulating layer. The second insulating layer is changed to a dielectric layer by performing an etching process on the second insulating layer until the first insulating layer is exposed by using the etching mask. Another aspect is a display device, comprising: a first insulating layer formed on a first substrate; a lower electrode formed on the first insulating layer; a dielectric layer formed to surround the top and side of the lower electrode, wherein the dielectric layer does not cover a pixel region of the display device; and an upper electrode formed on the dielectric layer.

In the above device, the dielectric layer covers only the top and side of the lower electrode. In the above device, the first insulating layer is formed of silicon oxide and wherein the dielectric layer is formed of silicon nitride. In the above device, the side of the dielectric layer is substantially perpendicular to the substrate. In the above device, the dielectric layer and upper electrode are substantially aligned along a direction substantially perpendicular to the substrate, wherein the length of the dielectric layer is greater than that of the upper electrode, and where the lengths are defined along a direction substantially parallel with the substrate.

The above device further comprises: a semiconductor layer interposed between the first substrate and the first insulating layer, wherein the semiconductor layer has a channel region, a source region, and a drain region; a gate electrode formed on the first insulating layer to overlap with the channel region; and source and drain electrodes electrically connected to the source region and the drain region, respectively.

In the above device, the source electrode or drain electrode is electrically connected to the upper electrode, wherein the device further comprises: a second insulating layer formed on i) the first insulating layer, ii) the gate electrode, iii) the upper electrode and iv) part of the dielectric layer; and a third insulating layer formed on the second insulating layer; a pixel electrode electrically connected to the source or drain electrode through a via-hole formed in the third insulating layer; a second substrate disposed to face the first substrate; a common electrode formed on the second substrate; and a liquid crystal layer interposed between the first substrate and the second substrate.

The above device further comprises: a second insulating layer formed on i) the first insulating layer, ii) the gate electrode, iii) the upper electrode and iv) part of the dielectric layer; a third insulating layer formed on the second insulating layer; a pixel electrode formed on the third insulating layer and electrically connected to the source or drain electrode through a via-hole formed in the third insulating layer; a pixel defining film formed on the third insulating layer and a first portion of the pixel electrode; an organic light emitting layer formed on a second portion of the pixel electrode and part of the pixel defining film, wherein the first and second portions of the pixel electrode do not overlap with each other; and a cathode electrode formed on the organic light emitting layer and pixel defining film, wherein the pixel electrode is used as an anode electrode.

Another aspect is a method of manufacturing a display device, comprising: forming a first insulating layer over a substrate; forming a lower electrode on the first insulating layer; forming a second insulating layer on the lower electrode and the first insulating layer; forming a conductive layer on the second insulating layer; forming an etching mask layer on the conductive layer, wherein the etching mask layer is located substantially directly above the lower electrode, wherein the length of the etching mask layer is greater than that of the lower electrode, and where the lengths are defined along a direction substantially parallel with the substrate; and etching the conductive layer and the second insulating layer until the first insulating layer is exposed so that the conductive layer and the second insulating layer convert to an upper electrode and a dielectric layer, respectively.

In the above method, the first insulating layer has etching selectivity with respect to the second insulating layer, and wherein the etching selectivity represents a difference in etch rate with respect to predetermined etching. In the above method, the first insulating layer is formed of silicon oxide and wherein the second insulating layer is formed of silicon nitride.

In the above method, the etching is performed by one of an etch-back process and an anisotropic etching process. In the above method, the etching is performed such that the dielectric layer covers only the lower electrode. In the above method, the etching mask layer is formed of a photosensitive material. In the above method, the etching is performed such that the dielectric layer is not formed in a pixel region of the display device.

Another aspect is a method of manufacturing a display device, comprising: forming a first insulating layer over a substrate; forming a lower electrode on the first insulating layer; forming a second insulating layer on the lower electrode and the first insulating layer; forming an upper electrode on the second insulating layer so as to overlap with the lower electrode; forming an etching mask layer on the second insulating layer so as to cover the side and top of the upper electrode, wherein the etching mask layer has an outer side positioned outer than the outer side of the lower electrode; and etching the second insulating layer until the first insulating layer is exposed so that the second insulating layer converts to a dielectric layer.

In the above method, the etching is performed such that the dielectric layer is not formed in a pixel region of the display device. In the above method, the first insulating layer is formed of silicon oxide and wherein the second insulating layer is formed of silicon nitride. The above method further comprises forming a thin film transistor (TFT) over the substrate before the etching, wherein the TFT comprises a gate electrode, and wherein the etching is performed such that the dielectric layer does not contact the gate electrode. In the above method, the upper electrode is located substantially directly above the lower electrode, wherein the length of the upper electrode is greater than that of the lower electrode, and wherein the lengths are defined along a direction substantially parallel with the substrate

DETAILED DESCRIPTION OF CERTAIN INVENTIVE EMBODIMENTS

Figure 1:
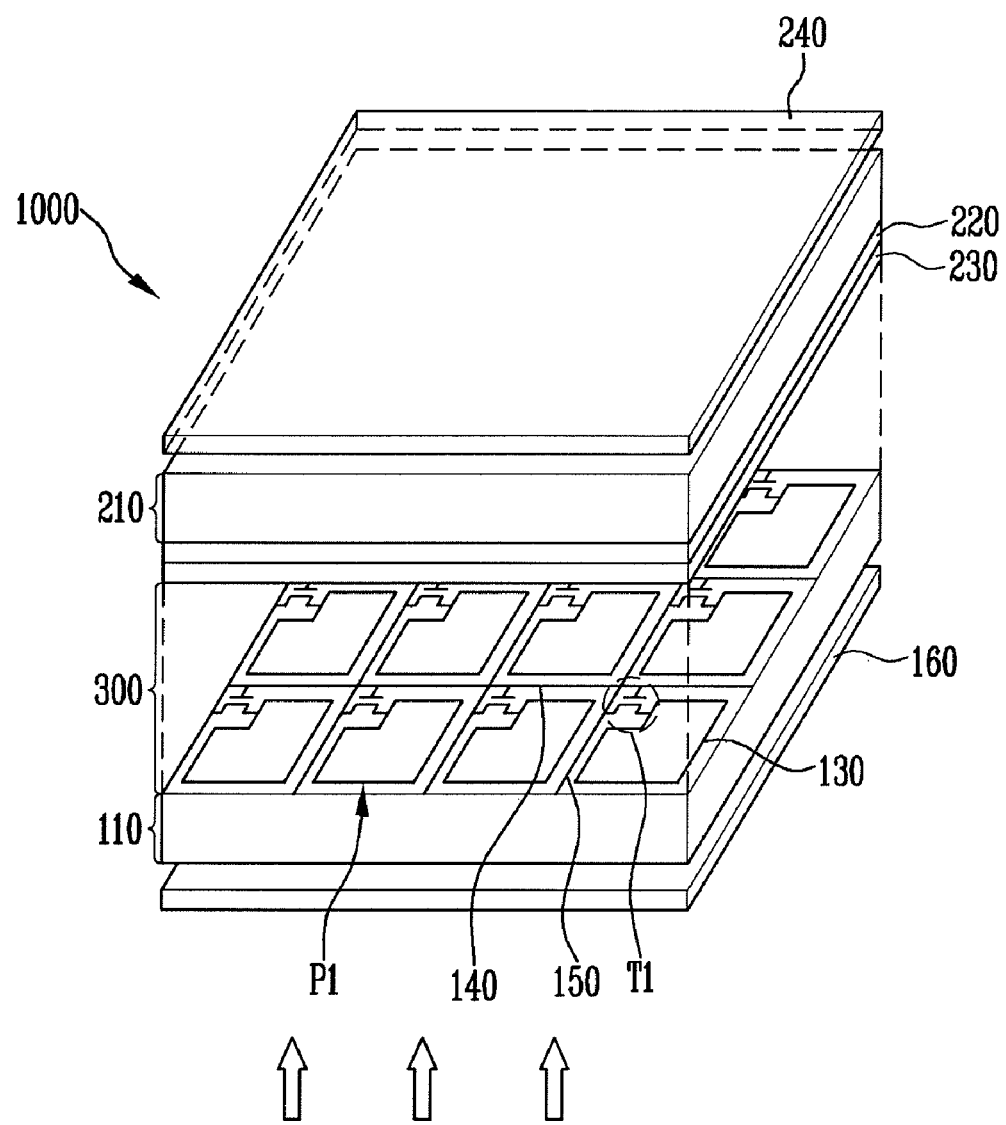
FIG. 1 is a perspective view for describing one embodiment of a display device according to one embodiment of the present invention.

The active matrix type LCD device (TFT-LCD) generally includes i) a display panel in which liquid crystal is injected between two substrates, ii) a back light unit that is positioned on a back surface of the display panel and used as a light source, and iii) a driving unit (drive IC) for driving the display panel. Light provided from the back light unit is input into the display panel and the light is modulated by the liquid crystal oriented in accordance with a signal provided from the driving unit to be emitted to the outside to display the character or moving picture.

Further, the organic light emitting display device (AMOLED) of the active matrix type includes a display panel where the organic light emitting diode is formed and a driving unit for driving the display panel. The light emitted from the organic light emitting diode in accordance with a signal provided from the driving unit is used to display the character or moving picture. In the liquid crystal display device and the organic light emitting display device, optical transmittance in the display panel has a large influence on luminance.

The active matrix type display device includes the thin film transistor. Since insulating layers such as a silicon oxide film, a silicon nitride film, etc., are formed on a substrate of a pixel region through which the light transmits in a lamination structure during manufacturing the display device, the optical transmittance and dispersion degree of light are deteriorated by the insulating layers. For example, since the silicon nitride film has a high dielectric constant, the silicon nitride film used as the insulating layer is generally formed to be thick. In this case, due to the low transmittance of the silicon nitride film, the optical transmittance and dispersion degree of the light are deteriorated, thereby reducing the luminance.

Recently, there has been a tendency that the size of the display panel decreases and the resolution increases according to a user's preferences. When the size of the display panel decreases, the size (aperture ratio) of the pixel region through which the light transmits decreases. As a result, the size of a capacitor inevitably decreases in order to ensure luminance of a predetermined level or higher. It is desirable that the thickness of a dielectric layer is reduced in order to decrease the size of the capacitor while ensuring capacitance of at least a predetermined level. In this case, yield decreases and the electrical characteristics and reliability of the thin film transistor may be reduced.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Hereinafter, embodiments of a display device and a method of manufacturing the same will be described with reference to the accompanying drawings. Herein, shapes, sizes, ratios, angles, numbers, operations, etc. shown in the accompanying drawings are schematic and may partially be modified. Since the drawings are illustrated by observer's eyes, a direction or a position used to illustrate the drawings may variously be changed depending on the position of the observer. Although reference numerals are different, like elements refer to like reference numerals. When 'include', 'have', 'constituted by', etc., are used, another part may be added as long as 'only~' is not used. When an element is described as the singular, it may be interpreted as the plural number. Although the comparison, positional relationship, etc., of the numerical values, sizes, and shapes are not described by 'approximately', 'substantially', etc., they are interpreted to include a typical error range. Although terms such as 'after~', 'before~', 'continually', 'in addition', 'herein', 'subsequently', etc., are used, they are not used as a meaning defining a temporal position. Terms such as 'first', 'second', etc., are selectively, replaceably, or repetitively for convenience of simple classification and are not interpreted as a limited meaning. When the positional relationship between two parts is described by 'on~', 'above~', 'below~', 'beside~', etc., one or more other parts may be interposed between the two parts as long as 'just' is not used. When the parts are connected with each other by 'or~', the parts are interpreted singly or to include even a combination thereof, but when they are connected with each other by 'or~ and one of~', they are interpreted only singly. 'Comparative Example' is just used for comparison and does not necessarily mean the conventional art.

FIG. 1 is a perspective view for describing a display device according to an embodiment of the present invention and schematically and primarily describes a display panel 1000 displaying a picture image.

Referring to FIG. 1, the display panel 1000 includes two substrates 110 and 210 that are opposed to each other and a liquid crystal layer 300 interposed between two substrates 110 and 210.

Pixels P1 are defined by a plurality of gate lines 140 and data lines 150 that are arranged in a matrix on the substrate 110. A thin film transistor T1 controlling a signal supplied to each pixel P1 and a pixel electrode 130 connected to the thin film transistor T1 are formed on the region of the substrate 110 where the gate line 140 and the data line 150 intersect with each other. A capacitor (not shown) for holding the signal is connected to the thin film transistor T1.

A color filter 220 and a common electrode 230 are formed on the substrate 210. In addition, polarizing plates 160 and 240 are formed on back surfaces of the substrates 110 and 210, respectively and a back light unit (not shown) is disposed below of the polarizing plate 160 as a light source.

Further, a driving unit (LCD drive IC) (not shown) for driving the pixel P1 is mounted on the display panel 1000. The driving unit converts an electrical signal provided from the outside into a scan signal and a data signal and provides it to the gate line 140 and the data line 150.

Figure 2:
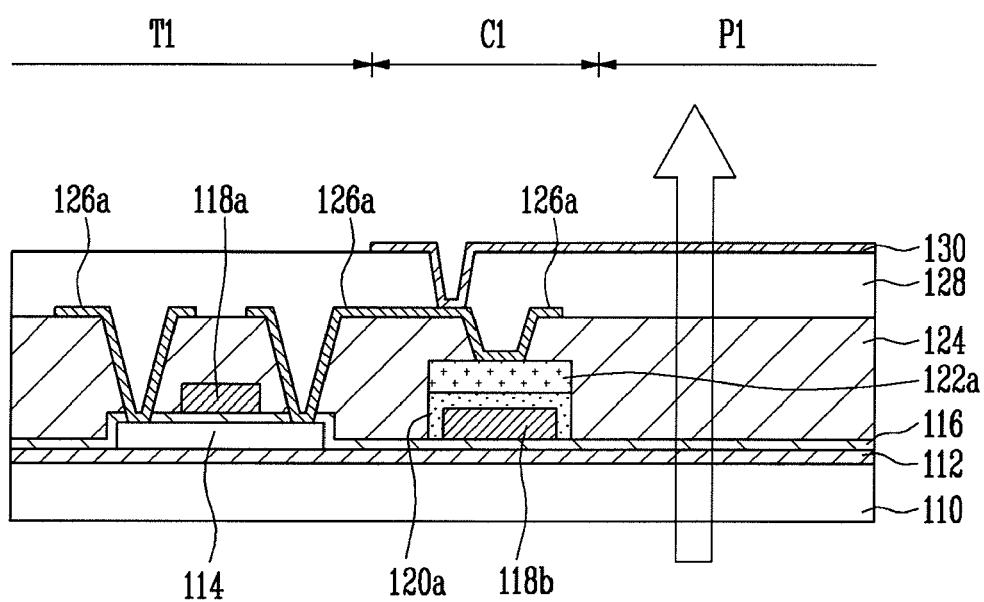
FIG. 2 is a cross-sectional view for specifically describing a substrate of FIG. 1.

FIG. 2 is a cross-sectional view for more specifically describing the substrate 110 of FIG. 1 and shows a capacitor C1 connected with the thin film transistor T1 together therewith.

Referring to FIGS. 1 and 2, the tin film transistor T1 and the capacitor C1 are formed on the substrate 110 and a buffer layer 112 may be formed on the substrate 110.

The thin film transistor T1 is formed on the substrate 110 and includes a semiconductor layer 114, a first insulating layer 116, a gate electrode 118a, a third insulating layer 124 and source and drain electrodes 126a. The semiconductor layer 114 includes a channel region, a source region, and a drain region. The first insulating layer 116 is formed on the substrate 110 and the semiconductor layer 114. The gate electrode 118a is formed on the channel region of the first insulating layer 116. The third insulating layer 124 is formed on the first insulating layer 116, the gate electrode 118a and an upper electrode 122a of the capacitor C1. The source and drain electrodes 126a are electrically connected to the source and drain regions of the semiconductor layer 114 through contact holes formed on the first insulating layer 116 and the third insulating layer 124.

The capacitor C1 is formed on the first insulating layer 116 to be spaced from the thin film transistor T1. The capacitor C1 includes i) a lower electrode 118b formed on the first insulating layer 116, ii) a dielectric layer 120a formed on the lower electrode 118b, and iii) the upper electrode 122a formed on the dielectric layer 120a. In one embodiment, the dielectric layer 120a includes silicon nitride and is formed to surround the top and side of the lower electrode 118b.

A fourth insulating layer 128 is formed on i) the third insulating layer 124 and ii) the source and drain electrodes 126a. A pixel electrode 130 is electrically connected to the source or drain electrode 126a and is formed on the fourth insulating layer 128 through a via-hole.

The substrate 210 where the color filter 220 and the common electrode 230 are formed is disposed on the top of the substrate 110 having the above-mentioned configuration to be opposed to the pixel electrode 130. The liquid crystal layer 130 is formed by injecting liquid crystal into a sealed space between the substrate 110 and the substrate 210.

In one embodiment, the dielectric layer 120a of the capacitor C1 is made of silicon nitride. Since the silicon nitride has a dielectric constant of approximately 7.4 higher than the silicon oxide having a dielectric constant of about 3.9, the silicon nitride can ensure a capacitive of a desired level even with a small thickness. Further, since the first insulating layer 116 and the third insulating layer 124 are made of, for example, the silicon oxide and since the fourth insulating layer 128 is made of, for example, an organic material, the dielectric layer 120a, formed of a silicon nitride film, is not formed in the pixel region P1 through which the light transmits (See FIG. 2). Accordingly, it is possible to ensure an aperture ratio of a predetermined size through reducing the size of the capacitor C1 and since the pixel region through which the light transmits does not contain the silicon nitride, it is possible to prevent the transmittance and dispersion degree of the light from being deteriorated.

Figure 3A:
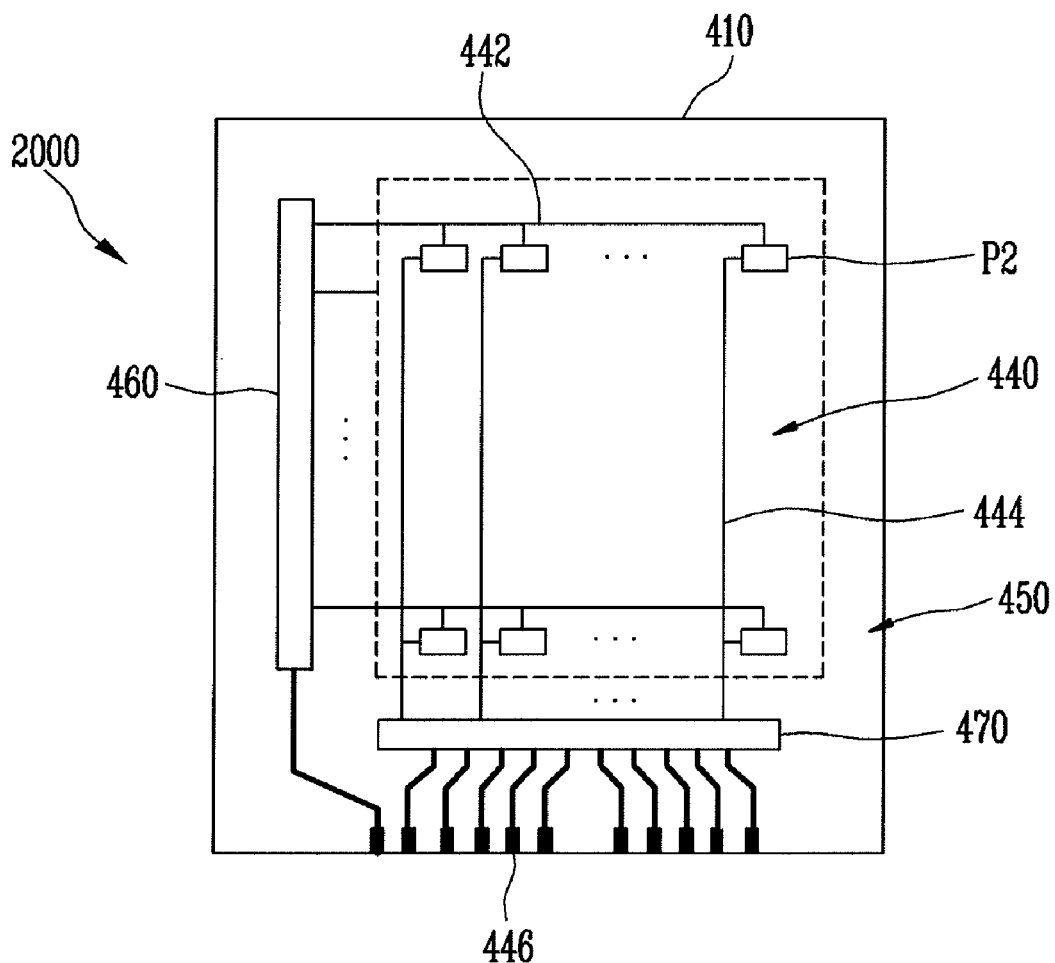
FIG. 3A is a plan view for describing a display device according to one embodiment of the present invention.
Figure 3B:
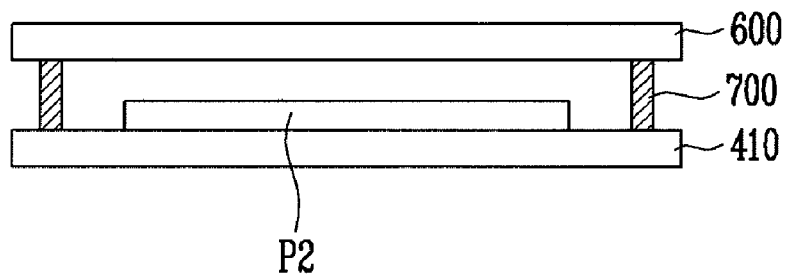
FIG. 3B is a cross-sectional view for describing a display device according to one embodiment of the present invention.

FIGS. 3A and 3B are a plan view and a cross-sectional view for describing another embodiment of the present invention and schematically and primarily describe a display panel 2000 displaying the picture image.

Referring to FIG. 3A, a substrate 410 is defined by a pixel region 440 and a non-pixel region 450 in the vicinity of the pixel region 440. A plurality of pixels P2 connected between scan lines 442 and data lines 444 in the matrix are formed on the pixel region 440 of the substrate 410. A power supply line (not shown) for operating a pixel 500, and a scan driving unit 460 and a data driving unit 470 are formed on the non-pixel region 450 of the substrate 410. The scan driving unit 460 and data driving unit 470 process the signal provided from the outside through a pad 446 and provide it to the scan line 442 and the data line 444. Part of the scan line 442 and part of the data line 444, connected to the scan driving unit 460 and data driving unit 470, respectively, are formed on the non-pixel region 450 of the substrate 410 (See FIG. 3A).

The pixel P2 includes an organic light emitting diode, a thin film transistor for controlling an operation of the organic light emitting diode, and a capacitor for storing the signal.

Referring to FIG. 3B, a sealing substrate 600 for sealing the pixel region 440 is disposed on the top of the substrate 410 having the above-mentioned configuration and the sealing substrate 600 is attached onto the substrate 410 by a sealant 700 to complete the display panel 2000.

Figure 4:
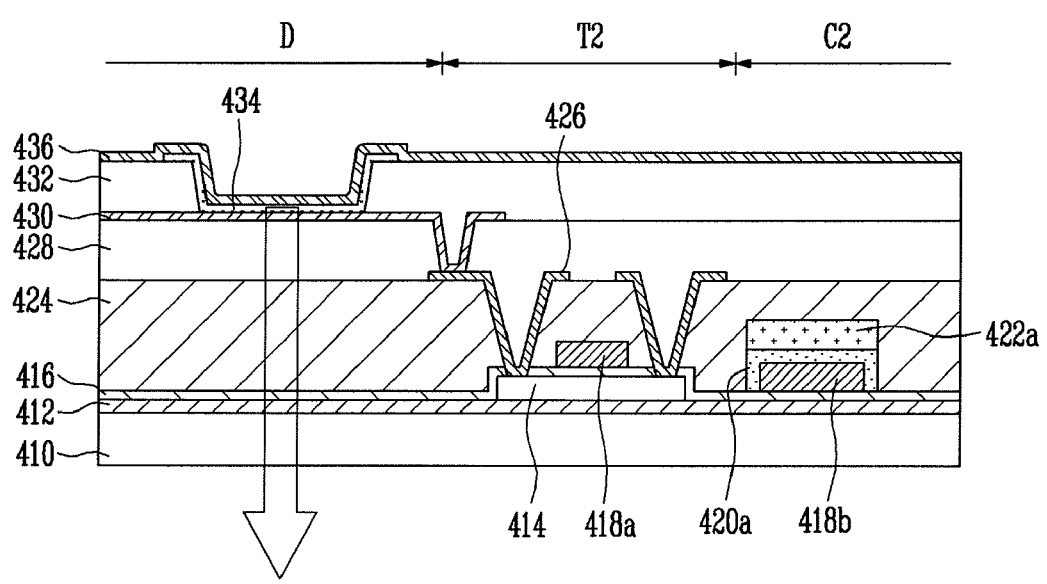
FIG. 4 is a cross-sectional view for specifically describing a substrate of FIG. 3A.

FIG. 4 is a cross-sectional view for more specifically describing the substrate 410 of FIG. 3A and shows an organic light emitting diode D, a thin film transistor T2, and a capacitor C2 configuring the pixel P2.

In one embodiment, as shown in FIGS. 3A and 4, the organic light emitting diode D, the thin film transistor T2, and the capacitor C2 are formed on the substrate 410 and a buffer layer 412 is formed on the substrate 410.

First, the thin film transistor T2 is formed on the substrate 410 and includes i) a semiconductor layer 414 having a channel region, a source region, and a drain region, ii) a first insulating layer 416 formed over the substrate 410 and formed on the semiconductor layer 414 and iii) a gate electrode 418a formed on the first insulating layer 416 and substantially directly above the channel region of the semiconductor layer 414. The thin film transistor T2 also includes 1) a second insulating layer 424 formed on i) the first insulating layer 416, ii) the gate electrode 418a, iii) an upper electrode 422a and iv) a dielectric layer 420a, 2) source and drain electrodes 426. The source and drain electrodes 426 are electrically connected to the source and drain regions of the semiconductor layer 414 through contact holes and formed on the first insulating layer 416 and the second insulating layer 424.

The capacitor C2 includes a lower electrode 418b formed on the first insulating layer 416, the dielectric layer 420a made of for example, silicon nitride to surround the lower electrode 418b, and the upper electrode 422a formed on the dielectric layer 420a.

A third insulating layer 428 is formed on the second insulating layer 424 and the source and drain electrodes 426. A pixel electrode 430 electrically connected to the source or drain electrode 426 is formed on the third insulating layer 428 through a via-hole.

The organic light emitting diode D includes i) the pixel electrode 430, ii) a pixel defining film 432 that is formed on the pixel electrode 430 and where an aperture is formed to expose the pixel electrode 430, iii) an organic light emitting layer 434 formed on the pixel electrode 430 of a light emitting region, and iv) a cathode electrode 436 formed on the organic light emitting layer 434.

In one embodiment, the dielectric layer 420a of the capacitor C2 is made of the silicon nitride. Since the silicon nitride has a dielectric constant of approximately 7.4 higher than the silicon oxide having a dielectric constant of about 3.9, the silicon nitride can ensure a capacitive of a desired level even with a small thickness. Further, since the first insulating layer 416 and the second insulating layer 424 are made of the silicon oxide and since the third insulating layer 428 is made of the organic material, the dielectric layer 420a, formed of a silicon nitride film, needs not and is not formed in the pixel region through which the light transmits. Accordingly, it is possible to ensure an aperture ratio of a predetermined size through reducing the size of the capacitor C2 and since the pixel region through which the light transmits does not contain the silicon nitride, it is possible to prevent the transmittance and dispersion degree of the light from being deteriorated.

Then, embodiments of the present invention will be described in more detail through a method of manufacturing the display device having the above-mentioned configuration.

FIGS. 5A to 5G are cross-sectional views for describing a method of manufacturing a display device according to an embodiment of the present invention and describe the display device of FIG. 2 as an example.

Figure 5A:
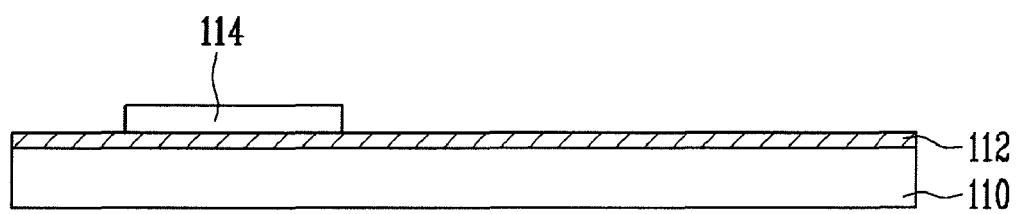
FIGS. 5A to 5G are cross-sectional views for describing a method of manufacturing a display device according to one embodiment of the present invention.

Referring to FIG. 5A, a transparent substrate 110 such as glass or plastic is prepared. First, the buffer layer 112 is formed on the substrate 110 so as to prevent impurities from being dispersed and the semiconductor layer 114 providing the source region, the drain region, and the channel region of the thin film transistor T1 is formed on the buffer layer 112.

Figure 5B:
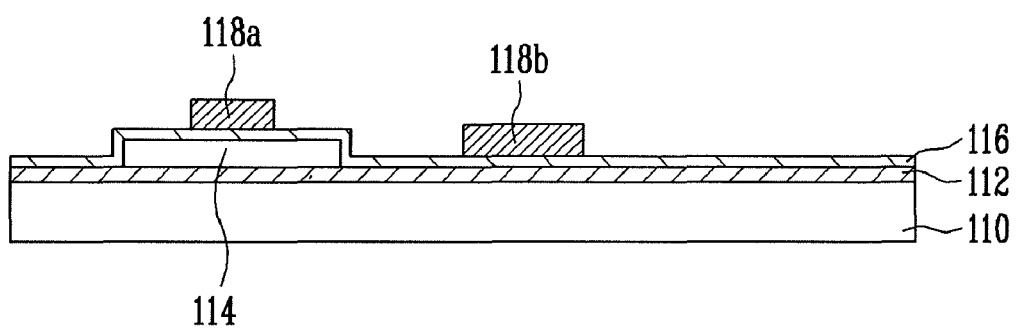

Referring to FIG. 5B, the first insulating layer 116 is formed on the buffer layer 112 and the semiconductor layer 114. The gate electrode 118a is formed on the first insulating layer 116 on the top of the channel region by forming and patterning the conductive layer on the first insulting layer 116. The lower electrode 118b of the capacitor C1 is formed on the first insulating layer 116 at one side portion of the gate electrode 118a.

Figure 5C:
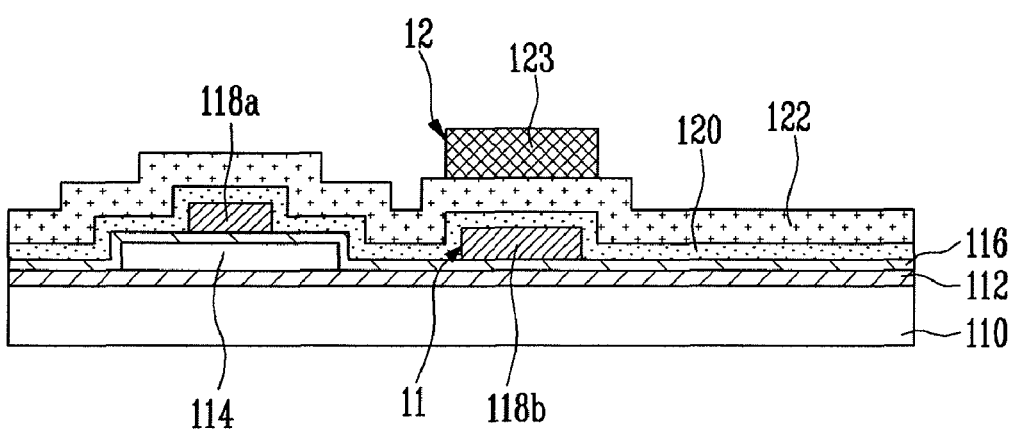

Referring to FIG. 5C, the second insulating layer 120 and a conductive layer 122 formed of a conductive material such as metal, etc., are sequentially formed on the first insulating electrode 116, the gate electrode 118a and the lower electrode 118b. In one embodiment, the second insulating layer 120 includes a material having an etching selectivity with respect to the first insulating layer 116. The etching selectivity represents a difference in etch rate with respect to predetermined etching.

For example, when the first insulating layer 116 includes the silicon oxide, the second insulating layer 120 may include the silicon nitride. As another example, when the first insulating layer 116 includes the silicon nitride, the second insulating layer 120 may include the silicon oxide.

An etching mask (or an etching mask layer) 123 is formed on the conductive layer 122. Herein, an outer side 12 of the etching mask 123 is positioned outer than an outer side 11 of the lower electrode 118b. For example, the etching mask 123 and lower electrode 118b are substantially aligned along a direction substantially perpendicular to the substrate 110. Further, the length of the etching mask 123 is greater than that of the lower electrode 118b, where the lengths are measured along a direction substantially parallel with the substrate. Herein, the etching mask 123 may include a photosensitive material.

Figure 5D:
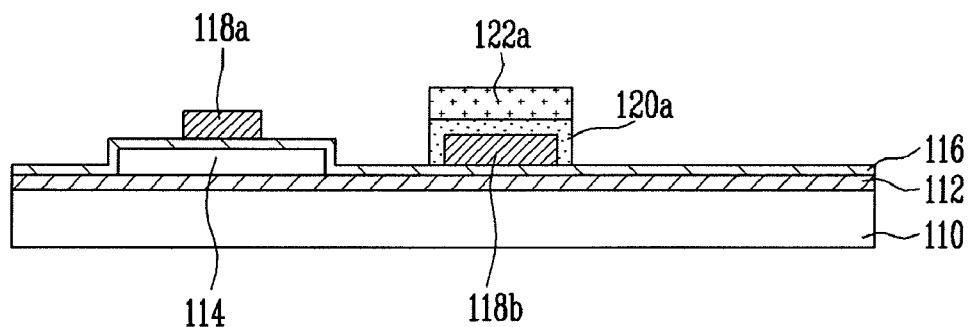

Referring to FIG. 5D, by sequentially etching the conductive layer 122 and the second insulating layer 120 by performing an etching process using the etching mask 123, the conductive layer 122 and the second insulating layer 120 are converted into the upper electrode 122a and the dielectric layer 120a, respectively.

Therefore, the capacitor C1, including the lower electrode 118b, the dielectric layer 120a, and the upper electrode 122a, is formed. Thereafter, the etching mask 123 is removed through, for example, an ashing or stripping process.

As described above, since the outer side 12 of the etching mask 123 is positioned outer than the outer side 11 of the lower electrode 118b, the dielectric layer 120a is formed to surround the side and top of the lower electrode 118b.

Herein, the etching process may be an etch-back process. As described above, the first insulating layer 116 has the etching selectivity with respect to the second insulating layer 120. The etch-back process may be performed until the second insulating layer 120 is sufficiently etched. This is because when the first insulating layer 116 is exposed in the etching process, the first insulating layer serves as an etch stopper. Further, the etching process may be an anisotropic etching process. As a result, the side of the lower electrode 118*b* may have a vertical profile.

Figure 5E:
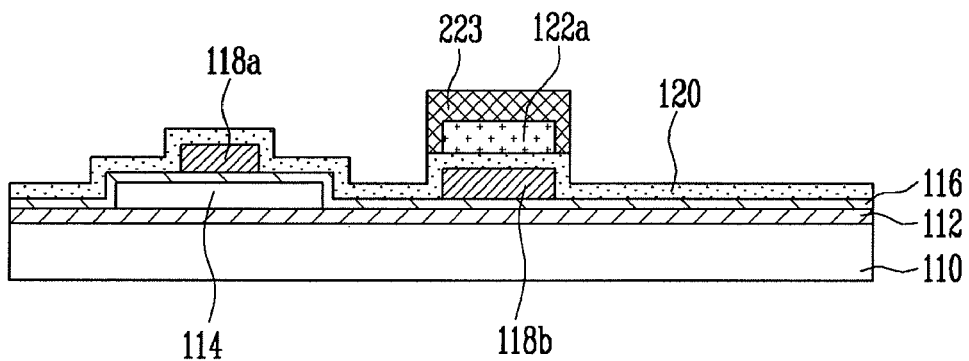

According to one embodiment of the present invention, as shown in FIG. 5E, the upper electrode 122*a* that overlaps the lower electrode 118*b* is formed on the second insulating layer 120. Subsequently, an etching mask 223 that covers the side wall and the top of the upper electrode 122*a* and has an outer side positioned outer than the outer side of the lower electrode is formed on the second insulating layer 120. In addition, the second insulating layer 120 may be converted into the dielectric layer 120*a* by performing the etching process on the second insulating layer 120 until the first insulating layer 116 is exposed using the etching mask 223.

Similarly even in this case, the first insulating layer 116 may have the etching selectivity with respect to the second insulating layer 120. For example, the first insulating layer 116 and the second insulating layer 120 may include the silicon oxide and the silicon nitride, respectively.

In addition, the etching process may be the etch-back process. Further, the etching process may be the anisotropic etching process. Moreover, the etching mask 223 may include the photosensitive material. Further, in some cases, the outer side of the upper electrode 122*a* may be positioned outer than the outer side of the lower electrode 118*b*.

Figure 5F:
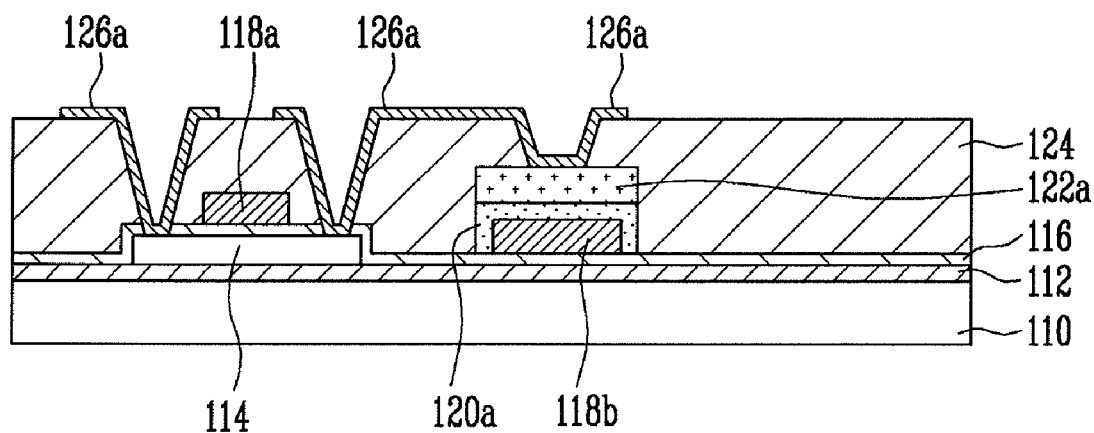

Referring to FIG. 5F, the third insulating layer 124 is formed on the entire top. A contact hole is formed so as to expose i) the source and drain regions of the semiconductor layer 114 and ii) the upper electrode 122*a* by patterning the third insulating layer 124 and the first insulating layer 116. The source and drain electrodes 126*a* are electrically connected to the source and drain regions of the semiconductor layer 114 through the contact hole. The source and drain electrodes 126*a* electrically connected to the upper electrode 122*a* are formed on the third insulating layer 124.

Figure 5G:
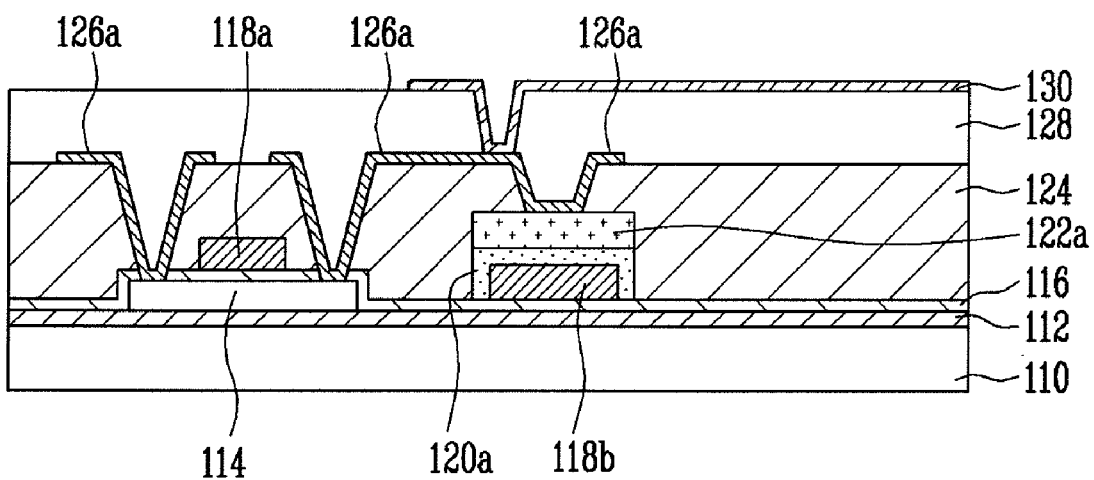

Referring to FIG. 5G, a via-hole is formed so as to expose the source or drain electrode 126*a* by forming and patterning the fourth insulating layer 128 on the entire top. The pixel electrode 130, electrically connected to the source or drain electrode 126*a* through the via-hole, is formed on the fourth insulating layer 128. The pixel electrode 130 is formed of, for example, transparent electrode materials such as ITO and IZO.

In one embodiment, as shown in FIG. 1, the substrate 110 and the substrate 210 are attached to each other by using a sealant (not shown) in the state where the substrate 110 and the substrate 210 are spaced from each other by a predetermined gap with a spacer (not shown). In addition, the display panel is completed by interposing the liquid crystal layer 300 between the substrate 110 and the substrate 210.

In the display device having the display panel 1000, the light is provided from the back light unit installed on the back surface of the substrate 110 to the liquid crystal layer 300 of the pixel region. The light is modulated by liquid crystal oriented in accordance with voltage applied from the driving unit to the pixel electrode 130 and the common electrode 230 and emitted to the outside through the substrate 210, thereby displaying a character or a picture image.

Figure 6A:
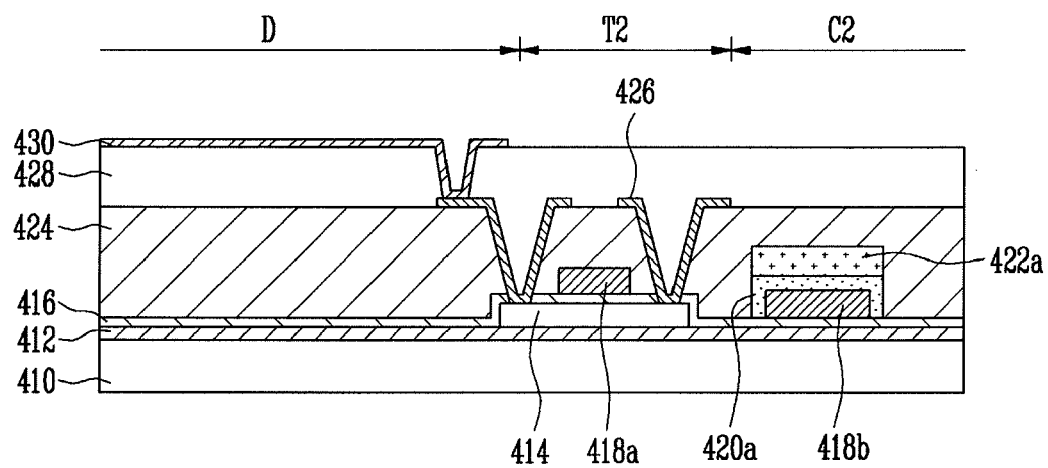
FIGS. 6A and 6B are cross-sectional views for describing a method of manufacturing a display device according to one embodiment of the present invention.
Figure 6B:
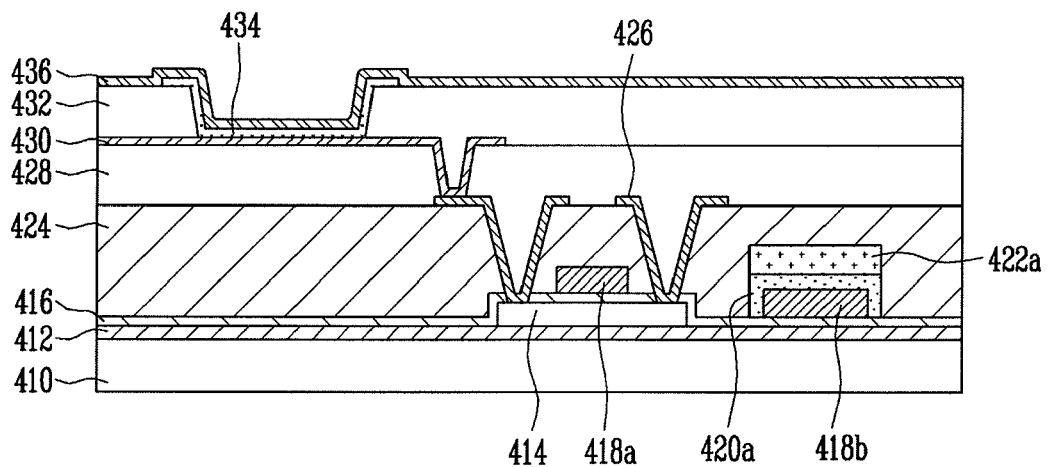

FIGS. 6A to 6B are cross-sectional views for describing a method of manufacturing a display device according to one embodiment of the present invention and describe the structure of FIG. 4 as an example.

Referring to FIG. 6A, the thin film transistor T2 and the capacitor C2 are formed through the same manufacturing process as FIGS. 5A to 5E. In addition, a via-hole is formed so as to expose the source or drain electrode 426 by forming and patterning the third insulating layer 428 on the thin film transistor T2 and the capacitor C2. The pixel electrode 430 electrically connected to the source or drain electrode 426 through the via-hole is formed on the third insulating layer 428. In one embodiment, the pixel electrode 430 is formed of transparent electrode materials such as ITO and IZO.

Referring to FIG. 6B, the pixel defining film (or layer) 432 is formed on the third insulating layer 428 and the pixel electrode 430. The pixel electrode of a light emitting region is exposed by patterning the pixel defining film 432. The organic light emitting layer 434 is formed on the exposed pixel electrode 430 and the cathode electrode 436 is formed on the pixel defining film 432 and the organic light emitting layer 434.

Referring to FIG. 3B, a sealing substrate 600 is disposed on the top of the substrate 410 having the above-mentioned configuration and the substrate 410 and the sealing substrate 600 are sealed to be attached to each other by a sealant 700 to complete the display panel 2000.

When a predetermined voltage is applied to the pixel electrode 430 and the cathode electrode 436, holes injected through the pixel electrode 430 and electrons injected through the cathode electrode 436 are recombined with each other in the organic light emitting layer 434. By a difference in energy generated during that process, light emitted from the organic light emitting layer 434 is emitted to the outside through the substrate 410, thereby displaying a character or a picture image.

According to at least one embodiment of the present invention, the insulating layer of the pixel region is formed only by silicon oxide and an organic material having comparatively high optical transmittance and does not include silicon nitride having low optical transmittance.

Figure 7A:
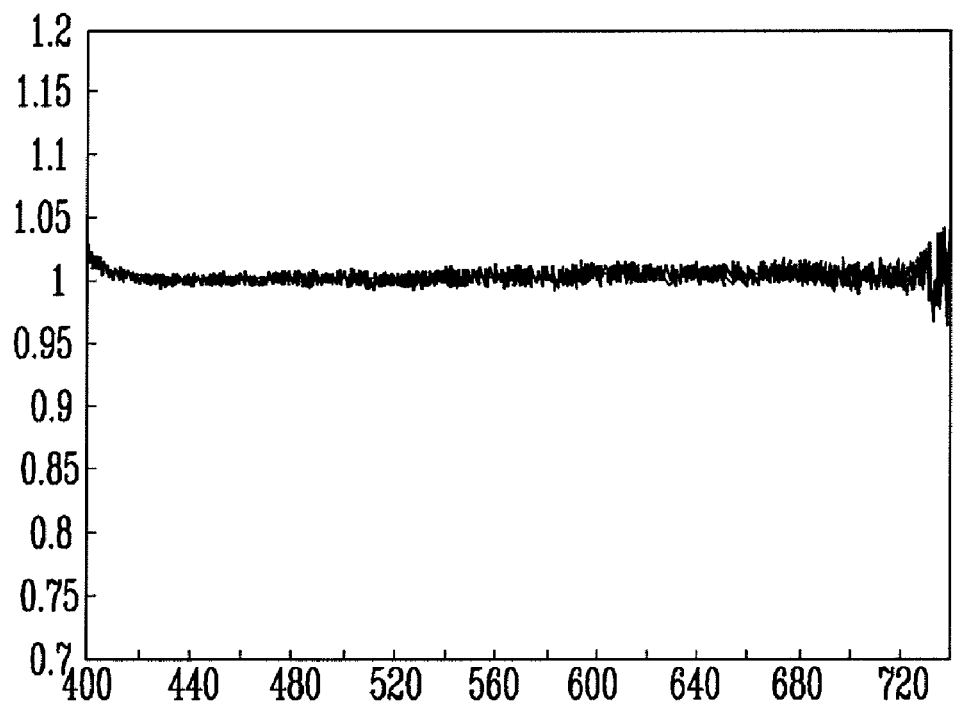
FIG. 7A is a graph showing optical transmittance of a silicon oxide film.
Figure 7B:
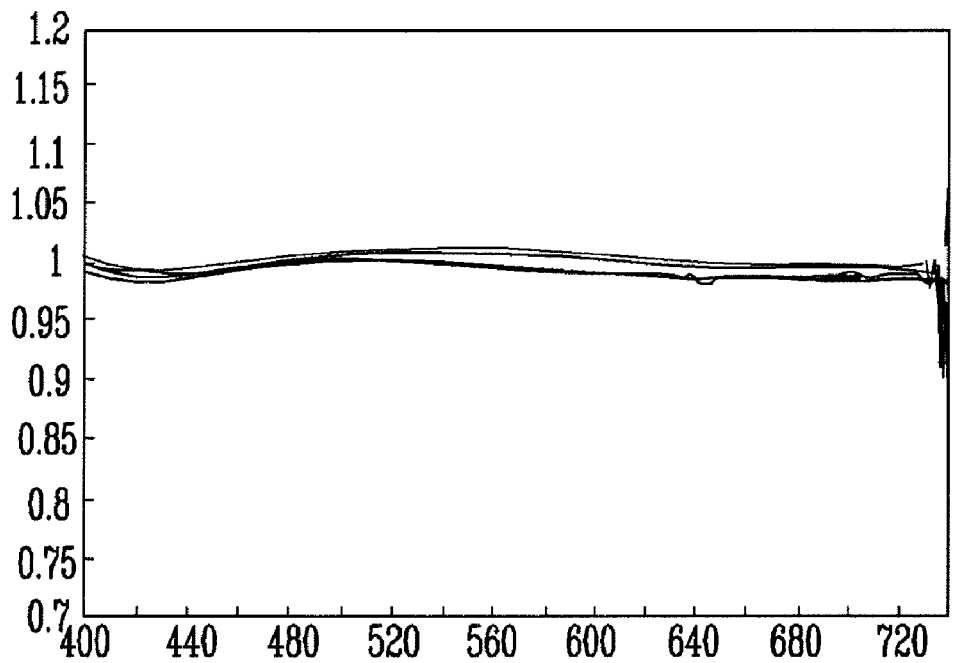
FIG. 7B is a graph showing optical transmittance of a display device according to one embodiment of the present invention.

FIG. 7A is a graph showing the optical transmittance of a silicon oxide film and FIG. 7B is a graph showing the optical transmittance of a display device according to one embodiment of the present invention. The optical transmittance is not almost deteriorated.

Figure 8A:
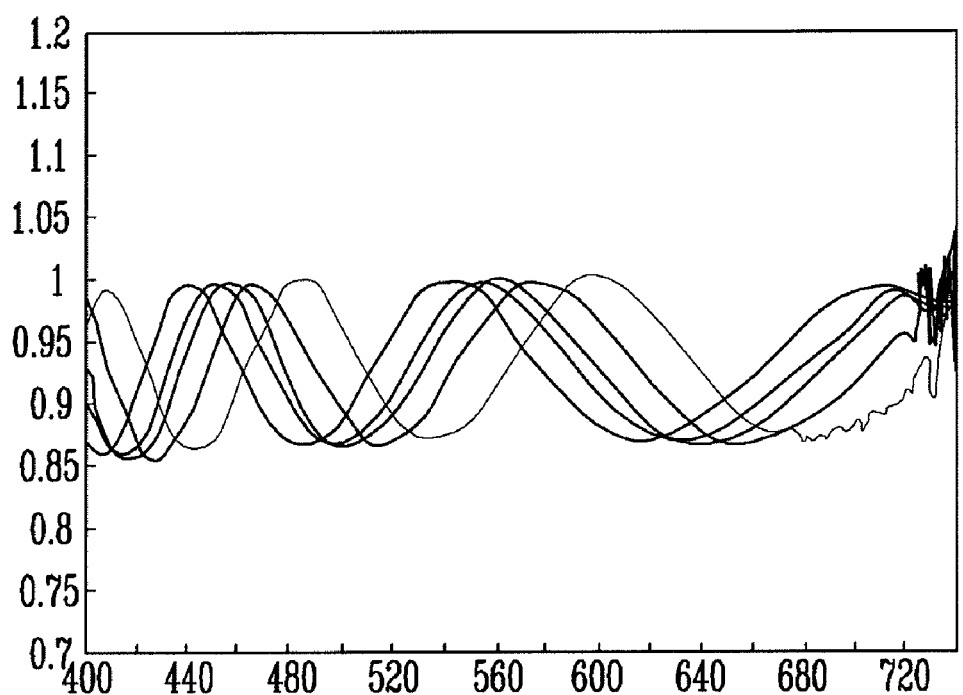
FIG. 8A is a graph showing optical transmittance of a silicon nitride film.
Figure 8B:
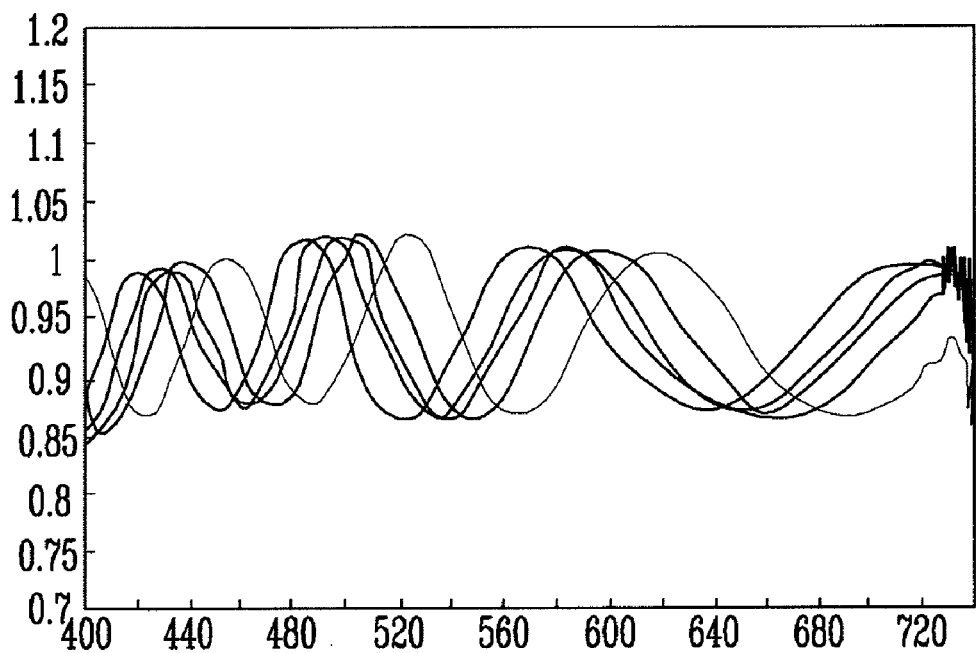
FIG. 8B is a graph showing optical transmittance of a comparative display device.

FIG. 8A is a graph showing the optical transmittance of a silicon nitride film and FIG. 8B is a graph showing the optical transmittance of a comparative display device. FIG. 8A shows the deterioration of the optical transmittance by approximately 8.6% in comparison with FIG. 7A and in the case where when the insulating layer is formed in a structure in which the silicon oxide film and the silicon nitride film are laminated. The optical transmittance and the dispersion degree of the comparative display device including the silicon nitride film decrease (see FIG. 8B). The decrease of the dispersion degree can be determined through oscillation of light.

According to an embodiment of the present invention, it is possible to decrease the size of a capacitor while ensuring capacitance of at least a predetermined level by using a silicon nitride film having a high dielectric constant as the dielectric of the capacitor. Further, since the silicon nitride film is not formed in a pixel region through which light transmits, it is possible to prevent a reduction of optical transmittance due to the silicon nitride film. Accordingly, an aperture ratio is ensured by a decrease in the size of the capacitor and the luminance and image quality of a display device can be improved.

Accordingly, a display device implemented according to at least one embodiment of the present invention has the optical transmittance improved by approximately 7% and can increase an aperture ratio by approximately 45% through a decrease in the size of the capacitor in comparison with the known display device.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A display device, comprising:
    a first insulating layer formed on a first substrate;
    a lower electrode formed on the first insulating layer;
    a dielectric layer formed to surround the top and side of the lower electrode, wherein the dielectric layer does not cover a pixel region of the display device; and
    an upper electrode formed on the dielectric layer.

2. The display device of claim 1, wherein the dielectric layer covers only the top and side of the lower electrode.

3. The display device of claim 2, wherein the first insulating layer is formed of silicon oxide and wherein the dielectric layer is formed of silicon nitride.

4. The display device of claim 1, wherein the side of the dielectric layer is substantially perpendicular to the substrate.

5. The display device of claim 1, wherein the dielectric layer and upper electrode are substantially aligned along a direction substantially perpendicular to the substrate, wherein the length of the dielectric layer is greater than that of the upper electrode, and where the lengths are defined along a direction substantially parallel with the substrate.

6. The display device of claim 1, further comprising:
    a semiconductor layer interposed between the first substrate and the first insulating layer, wherein the semiconductor layer has a channel region, a source region, and a drain region;
    a gate electrode formed on the first insulating layer to overlap with the channel region; and
    source and drain electrodes electrically connected to the source region and the drain region, respectively.

7. The display device of claim 6, wherein the source electrode or drain electrode is electrically connected to the upper electrode, wherein the device further comprises:
    a second insulating layer formed on i) the first insulating layer, ii) the gate electrode, iii) the upper electrode and iv) part of the dielectric layer; and
    a third insulating layer formed on the second insulating layer;
    a pixel electrode electrically connected to the source or drain electrode through a via-hole formed in the third insulating layer;
    a second substrate disposed to face the first substrate;
    a common electrode formed on the second substrate; and
    a liquid crystal layer interposed between the first substrate and the second substrate.

8. The display device of claim 6, further comprising:
    a second insulating layer formed on i) the first insulating layer, ii) the gate electrode, iii) the upper electrode and iv) part of the dielectric layer;
    a third insulating layer formed on the second insulating layer;
    a pixel electrode formed on the third insulating layer and electrically connected to the source or drain electrode through a via-hole formed in the third insulating layer;
    a pixel defining film formed on the third insulating layer and a first portion of the pixel electrode;
    an organic light emitting layer formed on a second portion of the pixel electrode and part of the pixel defining film, wherein the first and second portions of the pixel electrode do not overlap with each other; and
    a cathode electrode formed on the organic light emitting layer and pixel defining film,
    wherein the pixel electrode is used as an anode electrode.

9. A method of manufacturing a display device, comprising:
    forming a first insulating layer over a substrate;
    forming a lower electrode on the first insulating layer;
    forming a second insulating layer on the lower electrode and the first insulating layer;
    forming a conductive layer on the second insulating layer;
    forming an etching mask layer on the conductive layer, wherein the etching mask layer is located substantially directly above the lower electrode, wherein the length of the etching mask layer is greater than that of the lower electrode, and where the lengths are defined along a direction substantially parallel with the substrate; and
    etching the conductive layer and the second insulating layer until the first insulating layer is exposed so that the conductive layer and the second insulating layer convert to an upper electrode and a dielectric layer, respectively.

10. The method of manufacturing a display device of claim 9, wherein the first insulating layer has etching selectivity with respect to the second insulating layer, and wherein the etching selectivity represents a difference in etch rate with respect to predetermined etching.

11. The method of manufacturing a display device of claim 10, wherein the first insulating layer is formed of silicon oxide and wherein the second insulating layer is formed of silicon nitride.

12. The method of manufacturing a display device of claim 9, wherein the etching is performed by one of an etch-back process and an anisotropic etching process.

13. The method of manufacturing a display device of claim 9, wherein the etching is performed such that the dielectric layer covers only the lower electrode.

14. The method of manufacturing a display device of claim 9, wherein the etching mask layer is formed of a photosensitive material.

15. The method of manufacturing a display device of claim 9, wherein the etching is performed such that the dielectric layer is not formed in a pixel region of the display device.

16. A method of manufacturing a display device, comprising:
    forming a first insulating layer over a substrate;
    forming a lower electrode on the first insulating layer;
    forming a second insulating layer on the lower electrode and the first insulating layer;
    forming an upper electrode on the second insulating layer so as to overlap with the lower electrode;
    forming an etching mask layer on the second insulating layer so as to cover the side and top of the upper electrode, wherein the etching mask layer has an outer side positioned outer than the outer side of the lower electrode; and etching the second insulating layer until the first insulating layer is exposed so that the second insulating layer converts to a dielectric layer.

17. The method of manufacturing a display device of claim 16, wherein the etching is performed such that the dielectric layer is not formed in a pixel region of the display device.

18. The method of manufacturing a display device of claim 16, wherein the first insulating layer is formed of silicon oxide and wherein the second insulating layer is formed of silicon nitride.

19. The method of manufacturing a display device of claim 16, further comprising forming a thin film transistor (TFT) over the substrate before the etching, wherein the TFT comprises a gate electrode, and wherein the etching is performed such that the dielectric layer does not contact the gate electrode.

20. The method of manufacturing a display device of claim 16, wherein the upper electrode is located substantially directly above the lower electrode, wherein the length of the upper electrode is greater than that of the lower electrode, and wherein the lengths are defined along a direction substantially parallel with the substrate.

* * * * *

(12) EX PARTE REEXAMINATION CERTIFICATE (46th)
Ex Parte Reexamination Ordered under 35 U.S.C. 257

United States Patent
Park et al.

(10) Number: US 8,390,751 C1
(45) Certificate Issued: Dec. 15, 2015

(54) DISPLAY DEVICE AND METHOD OF MANUFACTURING THE SAME

(75) Inventors: Kyung-Min Park, Yongin (KR); Ji-Yong Park, Yongin (KR); Jin-Suk Park, Yongin (KR); Sung-In Ro, Yongin (KR)

(73) Assignee: Samsung Display Co., Ltd.

Supplemental Examination Request:
No. 96/000,095, May 6, 2015

Reexamination Certificate for:
Patent No.: 8,390,751
Issued: Mar. 5, 2013
Appl. No.: 12/957,233
Filed: Nov. 30, 2010

(30) Foreign Application Priority Data

Dec. 9, 2009 (KR) .................. 10-2009-0121773

(51) Int. Cl.
*G02F 1/1343* (2006.01)
*H01L 51/56* (2006.01)
*G02F 1/1362* (2006.01)
*H01L 27/12* (2006.01)
*H01L 27/32* (2006.01)

(52) U.S. Cl.
CPC ...... *G02F 1/136213* (2013.01); *H01L 27/1255* (2013.01); *H01L 27/3265* (2013.01); *G02F 2201/40* (2013.01); *H01L 51/56* (2013.01)

(58) Field of Classification Search
None
See application file for complete search history.

(56) References Cited

To view the complete listing of prior art documents cited during the supplemental examination proceeding and the resulting reexamination proceeding for Control Number 96/000,095, please refer to the USPTO's public Patent Application Information Retrieval (PAIR) system under the Display References tab.

*Primary Examiner* — Albert J Gagliardi

(57) ABSTRACT

A display device and a method of manufacturing the same are disclosed. In one embodiment, the display device includes: i) a first insulating layer formed on a first substrate, ii) a lower electrode formed on the first insulating layer, iii) a dielectric layer formed to surround the top and side of the lower electrode, wherein the dielectric layer does not cover a pixel region of the display device and iv) an upper electrode formed on the dielectric layer.

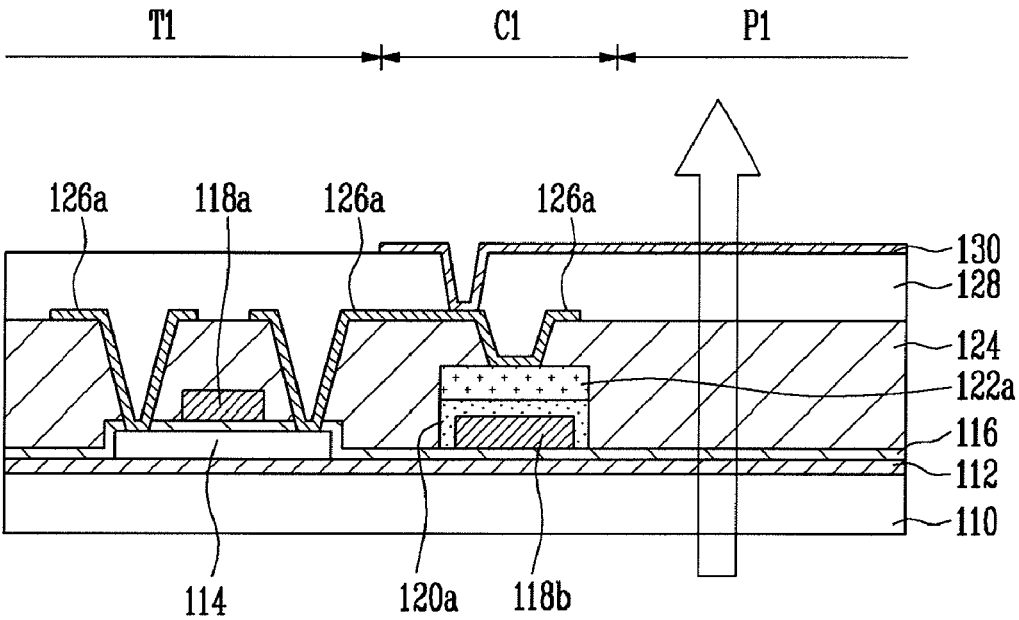

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 2, lines 12-22:

In the above device, the dielectric layer covers only the top and side of the lower electrode. In the above device, the first insulating layer is formed of silicon oxide and wherein the dielectric layer is formed of silicon nitride. In the above device, the side of the dielectric layer is substantially perpendicular to the substrate. In the above device, the dielectric layer and upper electrode are substantially aligned along a direction substantially perpendicular to the substrate, wherein the [length] *width* of the dielectric layer is greater than that of the upper electrode, and where the [lengths] *widths* are defined along a direction substantially parallel with the substrate.

Column 2, line 57 to column 3, line 4:

Another aspect is a method of manufacturing a display device, comprising: forming a first insulating layer over a substrate; forming a lower electrode on the first insulating layer; forming a second insulating layer on the lower electrode and the first insulating layer; forming a conductive layer on the second insulating layer; forming an etching mask layer on the conductive layer, wherein the etching mask layer is located substantially directly above the lower electrode, wherein the [length] *width* of the etching mask layer is greater than that of the lower electrode, and where the [lengths] *widths* are defined along a direction substantially parallel with the substrate; and etching the conductive layer and the second insulating layer until the first insulating layer is exposed so that the conductive layer and the second insulating layer convert to an upper electrode and a dielectric layer, respectively.

Column 3, lines 34-47:

In the above method, the etching is performed such that the dielectric layer is not formed in a pixel region of the display device. In the above method, the first insulating layer is formed of silicon oxide and wherein the second insulating layer is formed of silicon nitride. The above method further comprises forming a thin film transistor (TFT) over the substrate before the etching, wherein the TFT comprises a gate electrode, and wherein the etching is performed such that the dielectric layer does not contact the gate electrode. In the above method, the upper electrode is located substantially directly above the lower electrode, wherein the [length] *width* of the upper electrode is greater than that of the lower electrode, and wherein the [lengths] *widths* are defined along a direction substantially parallel with the substrate

AS A RESULT OF REEXAMINATION, IT HAS BEEN DETERMINED THAT:

Claims 1, 5, 7-9, 16 and 20 are determined to be patentable as amended.

Claims 2-4, 6, 10-15 and 17-19, dependent on an amended claim, are determined to be patentable.

New claim 21 is added and determined to be patentable.

1. A display device, comprising:
a first insulating layer formed on a first substrate;
a lower electrode formed on the first insulating layer;
a dielectric layer formed to surround the top and side of the lower electrode, wherein the dielectric layer does not cover a pixel region of the display device; and
an upper electrode formed on the dielectric layer, *wherein the upper electrode is not in direct physical contact with a pixel electrode.*

5. The display device of claim 1, wherein the dielectric layer and upper electrode are substantially aligned along a direction substantially perpendicular to the substrate, wherein [the length of the dielectric layer is greater than that of the upper electrode] *the dielectric layer has a width substantially the same as the width of the upper electrode and greater than the width of the lower electrode*, and where the [lengths] *widths* are defined along a direction substantially parallel with the substrate.

7. The display device of claim 6, wherein the source electrode or drain electrode is electrically connected to the upper electrode,
wherein the device further comprises:
a second insulating layer formed on i) the first insulating layer, ii) the gate electrode, iii) the upper electrode and iv) part of the dielectric layer; and
a third insulating layer formed on the second insulating layer;
[a] *the* pixel electrode electrically connected to the source or drain electrode through a via-hole formed in the third insulating layer;
a second substrate disposed to face the first substrate;
a common electrode formed on the second substrate; and
a liquid crystal layer interposed between the first substrate and the second substrate.

8. The display device of claim 6, further comprising:
a second insulating layer formed on i) the first insulating layer, ii) the gate electrode, iii) the upper electrode and iv) part of the dielectric layer;
a third insulating layer formed on the second insulating layer;
[a] *the* pixel electrode formed on the third insulating layer and electrically connected to the source or drain electrode through a via-hole formed in the third insulating layer;
a pixel defining film formed on the third insulating layer and a first portion of the pixel electrode;
an organic light emitting layer formed on a second portion of the pixel electrode and part of the pixel defining film, wherein the first and second portions of the pixel electrode do not overlap with each other; and
a cathode electrode formed on the organic light emitting layer and pixel defining film,
wherein the pixel electrode is used as an anode electrode.

9. A method of manufacturing a display device, comprising:
forming a first insulating layer over a substrate;
forming a lower electrode on the first insulating layer;

forming a second insulating layer on the lower electrode and the first insulating layer;

forming a conductive layer on the second insulating layer;

forming an etching mask layer on the conductive layer, wherein the etching mask layer is located substantially directly above the lower electrode, wherein the [length] *width* of the etching mask layer is greater than [that] *the width* of the lower electrode, and where the [lengths] *widths* are defined along a direction substantially parallel with the substrate; and etching the conductive layer and the second insulating layer until the first insulating layer is exposed so that the conductive layer and the second insulating layer convert to an upper electrode and a dielectric layer, respectively, *wherein the upper electrode is not in direct physical contact with a pixel electrode*.

16. A method of manufacturing a display device, comprising:

forming a first insulating layer over a substrate;

forming a lower electrode on the first insulating layer;

forming a second insulating layer on the lower electrode and the first insulating layer;

forming an upper electrode on the second insulating layer so as to overlap with the lower electrode;

forming an etching mask layer on the second insulating layer so as to cover the side and top of the upper electrode, wherein the etching mask layer has an outer side positioned outer than the outer side of the lower electrode; and etching the second insulating layer until the first insulating layer is exposed so that the second insulating layer converts to a dielectric layer,

*wherein the upper electrode is not in direct physical contact with a pixel electrode*.

20. The method of manufacturing a display device of claim 16, wherein the upper electrode is located substantially directly above the lower electrode, [wherein the length of the upper electrode is] *wherein the dielectric layer has a width substantially the same as the width of the upper electrode and* greater than [that] *the width* of the lower electrode, and wherein the [lengths] *widths* are defined along a direction substantially parallel with the substrate.

*21. The display device of claim 1, wherein the dielectric layer includes silicon nitride.*

\* \* \* \* \*